United States Patent
Pineda et al.

(10) Patent No.: US 7,592,807 B2
(45) Date of Patent: Sep. 22, 2009

(54) MAXIMUM LIKELIHOOD ESTIMATOR IN THE PRESENCE OF NON-IDENTICALLY DISTRIBUTED NOISE FOR DECOMPOSITION OF CHEMICAL SPECIES IN MRI

(75) Inventors: Angel R. Pineda, Fullerton, CA (US); Charles A. McKenzie, London (CA); Huanzhou Yu, Mountain View, CA (US); Scott B. Reeder, Middleton, WI (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 192 days.

(21) Appl. No.: 11/738,343

(22) Filed: Apr. 20, 2007

(65) Prior Publication Data

US 2008/0012566 A1 Jan. 17, 2008

Related U.S. Application Data

(60) Provisional application No. 60/745,602, filed on Apr. 25, 2006.

(51) Int. Cl.
*G01V 3/00* (2006.01)
(52) U.S. Cl. .................................... 324/307
(58) Field of Classification Search .......... 324/307; 600/410
See application file for complete search history.

(56) References Cited

U.S. PATENT DOCUMENTS

| | | | |
|---|---|---|---|
| 5,810,726 A | 9/1998 | Van Vaals et al. | |
| 5,830,143 A | 11/1998 | Mistretta et al. | |
| 5,910,728 A | 6/1999 | Sodickson | |
| 5,976,088 A | 11/1999 | Urbano et al. | |
| 6,086,537 A | 7/2000 | Urbano et al. | |
| 6,228,030 B1 | 5/2001 | Urbano et al. | |
| 6,252,979 B1 | 6/2001 | Lee et al. | |
| 6,289,232 B1 | 9/2001 | Jakob et al. | |
| 6,377,045 B1 | 4/2002 | Van Den Brink et al. | |
| 6,583,623 B1 | 6/2003 | Kwok et al. | |
| 6,605,943 B1 | 8/2003 | Clark et al. | |
| 6,714,010 B2 | 3/2004 | Madore | |
| 6,836,114 B2 | 12/2004 | Reddy et al. | |
| 6,903,551 B2 | 6/2005 | Madore | |
| 7,151,370 B1 | 12/2006 | Hargreaves | |
| 7,176,683 B2 * | 2/2007 | Reeder et al. | 324/307 |
| 7,199,583 B2 | 4/2007 | Ikezaki | |
| 7,298,144 B2 | 11/2007 | Reeder et al. | |

(Continued)

OTHER PUBLICATIONS

An et al., "Chemical Shift Imaging with Spectrum Modeling", Magn. Reson. Med. (2001) 46(1):126-130.

(Continued)

*Primary Examiner*—Brij B. Shrivastav
*Assistant Examiner*—Megann E Vaughn
(74) *Attorney, Agent, or Firm*—Beyer Law Group LLP (57) ABSTRACT

A method of separating signals from at least two species in a body using echo-coherent time magnetic resonance imaging is provided. A plurality of echo signals is acquired at acquisition times optimized based on the noise properties of images with different variance with possibly correlated noise resulting in possibly asymmetrically positioned images with respect to an echo time. The plurality of echo signals is combined iteratively by using a maximum likelihood decomposition algorithm for non-identically distributed noise.

20 Claims, 8 Drawing Sheets

U.S. PATENT DOCUMENTS

| | | | |
|---|---|---|---|
| 7,332,909 B2 | 2/2008 | Shaffter et al. | |
| 7,349,729 B2 | 3/2008 | Reeder et al. | |
| 7,394,252 B1 | 7/2008 | Lin | |
| 7,397,242 B2 | 7/2008 | Samsonov et al. | |
| 7,418,287 B2 | 8/2008 | Tsao et al. | |
| 2005/0085713 A1* | 4/2005 | Reeder et al. | 600/422 |
| 2005/0148858 A1* | 7/2005 | Hargreaves | 600/410 |
| 2007/0247153 A1 | 10/2007 | Yu et al. | |

OTHER PUBLICATIONS

An et al., "Water-Fat Imaging with Three Orthogonal-Phase Acquisitions", Proceedings 6$^{th}$ Scientific Meeting, International Society for Magnetic Resonance in Medicine (1998), 1866.

Brau et al., "Accelerated IDEAL Water-Fat Separation Techniques for Single- and Multi-Coil Applications", Proc. Intl. Soc. Mag. Reson. Med. 13 (2005) p. 491.

Bydder et al., "Fat Quantification by Modeling the Variation in Signal Amplitude with TE", Proc. Intl. Soc. Mag. Reson. Med. 14 (2006) p. 2298.

Dixon, "Simple Proton Spectroscopic Imaging", Radiology (1984) 153:189-194.

Fernandez-Real et al., "Cross-Talk between Iron Metabolism and Diabetes", Diabetes (2002), 51(8):2348-2354.

George et al., "Increased Hepatic Iron Concentration in Nonalcoholic Steatohepatitis is Associated with Increased Fibrosis", Gastroenterology (1998), 114(2):311-318.

Glover, G., "Multipoint Dixon Technique for Water and Fat Proton and Susceptibility Imaging", Journal of Magnetic Resonance Imaging (1991), 1:521-530.

McKenzie et al., "Abdominal Three Point Dixon Imaging with Self Calibrating Parallel MRI", in Proc. Intl. Soc. Mag. Reson. Med. 11 (2004), p. 917.

Moirand et al., "A New Syndrome of Liver Iron Overload with Normal Transferin Saturation", The Lancet (1997); 349 (9045):95-97.

Pineda et al., "Cramer-Rao Bounds for Three-Point Decomposition of Water and Fat", Magn. Reson. Med. (2005) 54(3):625-635.

Reeder et al., "Iterative Decomposition of Water and Fat with Echo Asymmetry and Least-Squares Estimation (IDEAL): Application with Fast Spin-Echo Imaging", Magn. Reson. Med. (2005), 54(3):636-644.

Reeder et al., "Multicoil Dixon Chemical Species Separation with an Iterative Least-Squares Estimation Method", Magn. Reson. Med. (2004) 51:35-45.

Westphalen et al., "Liver Fat: Effect of Hepatic Iron Deposition on Evaluation with Opposed-Phase MR Imaging", Radiology (2007), 242(2):450-455.

Wieben et al., "Multi-Echo Balanced SSFP Imaging for Iterative Dixon Reconstruction", Proc. Intl. Soc. Mag. Reson. Med. 13 (2005), p. 2386.

Yu et al., "Field Map Estimation with a Region Growing Scheme for Iterative 3-Point Water-Fat Decomposition", Magn. Reson. Med. (2005) 54(3):1032-1039.

Yu et al., "Single Acquisition Water-Fat Separation: Feasibility Study for Dynamic Imaging", Magn. Reson. Med. (2006) 55(2): 413-422.

Yu et al., "Single Quadrature Echo Water-Fat Separation with Robust Phase Correction", Proc. Intl. Soc. Mag. Reson. Med. 14 (2006), p. 2446.

U.S. Appl. No. 10/690,230, by Reeder et al. entitled "Magnetic Resonance Imaging of Different Chemical Species in a System Having Magnetic Field Heterogeneities", filed on Oct. 23, 2003 (published).

Office Action dated May 28, 2008 from U.S. Appl. No. 11/738,350.

Office Action dated Jun. 18, 2008 from U.S. Appl. No. 11/738,345.

Notice of Allowance dated Aug. 22, 2008 from U.S. Appl. No. 11/738,350.

Office Action dated Oct. 29, 2008 from U.S. Appl. No. 11/738,339.

Notice of Allowance dated Nov. 13, 2008 from U.S. Appl. No. 11/738,345.

Notice of Allowance dated Sep. 29, 2008 from U.S. Appl. No. 11/738,347.

Notice of Allowance dated Sep. 22, 2008 from U.S. Appl. No. 11/738,340.

* cited by examiner

MAXIMUM LIKELIHOOD ESTIMATOR IN THE PRESENCE OF NON-IDENTICALLY DISTRIBUTED NOISE FOR DECOMPOSITION OF CHEMICAL SPECIES IN MRI

CROSS REFERENCE TO RELATED APPLICATIONS

This application claims priority under 35 U.S.C. §119 from U.S. Provisional Patent Application No. 60/745,602, filed Apr. 25, 2006, entitled MRI METHODS FOR COMBINING SEPARATE SPECIES AND QUANTIFYING A SPECIES which is incorporated herein by reference for all purposes.

GOVERNMENT RIGHTS

The U.S. government has rights in the disclosed invention pursuant to NIH Grant No. P41RR09784 to Stanford University.

BACKGROUND OF THE INVENTION

This invention relates generally to magnetic resonance imaging of an object using a plurality of echo times.

Reliable and uniform fat suppression is essential for accurate diagnoses in many areas of MRI. "In and Out of Phase" Imaging was first described by Dixon in "Simple Proton Spectroscopic Imaging", Radiology (1984) 153:189-194, and was used to exploit the difference in chemical shifts between water and fat and in order to separate water and fat into separate images. Glover et al. further refined this approach, described in Glover G., "Multipoint Dixon Technique for Water and Fat Proton and Susceptibility Imaging", Journal of Magnetic Resonance Imaging (1991) 1:521-530, with a 3-point method that accounts for magnetic field inhomogeneities created by susceptibility differences. This method was applied with FSE imaging by acquiring three images with the readout centered at the spin-echo for one image and symmetrically before and after the spin-echo in the subsequent two images.

SUMMARY OF THE INVENTION

To achieve the foregoing and in accordance with the purpose of the present invention, a method of separating signals from at least two species in a body using echo-coherent time magnetic resonance imaging is provided. A plurality of echo signals is acquired. The plurality of echo signals is combined iteratively by using a maximum likelihood estimator which for images with different amounts of possibly correlated Gaussian noise becomes the weighted least squares algorithm.

In another manifestation of the invention a method of separating signals from at least two species in a body using echo-coherent time magnetic resonance imaging is provided. A magnetic resonance image excitation is provided. A plurality of echo signals are acquired at different echo times, wherein at least two echo signals of the plurality of echo signals have different variance from each other. The plurality of echo signals are combined iteratively by using a weighted least-squares decomposition algorithm, wherein a weighting of the weighted least-squares decomposition algorithm is dependent on a difference in the variances.

In another manifestation of the invention, an apparatus for separating signals from at least two species in a body using magnetic resonance imaging for providing magnetic resonance images is provided. A magnet system is provided. A controller is electrically connected to the magnet system and comprises a display, at least one processor, and computer readable media. The computer readable media comprises computer readable code for signaling the magnetic system to apply a magnetic resonance imaging excitation, computer readable code for signaling the magnetic system to acquire a plurality of magnetic resonance image echo signals at different echo times, wherein at least two echo signals of the plurality of echo signals have different variance from each other, computer readable codes for combining the plurality of echo signals iteratively by using a weighted least-squares decomposition algorithm, wherein a weighting of the weighted least-squares decomposition algorithm is dependent on a difference in the variances, and computer readable code for displaying an image created from combining the plurality of echo signals iteratively on the display.

The invention, objects, and features thereof will be more readily apparent from the following detailed description and appended claims when taken with the drawings.

DETAILED DESCRIPTION OF ILLUSTRATED EMBODIMENTS

Figure 1:
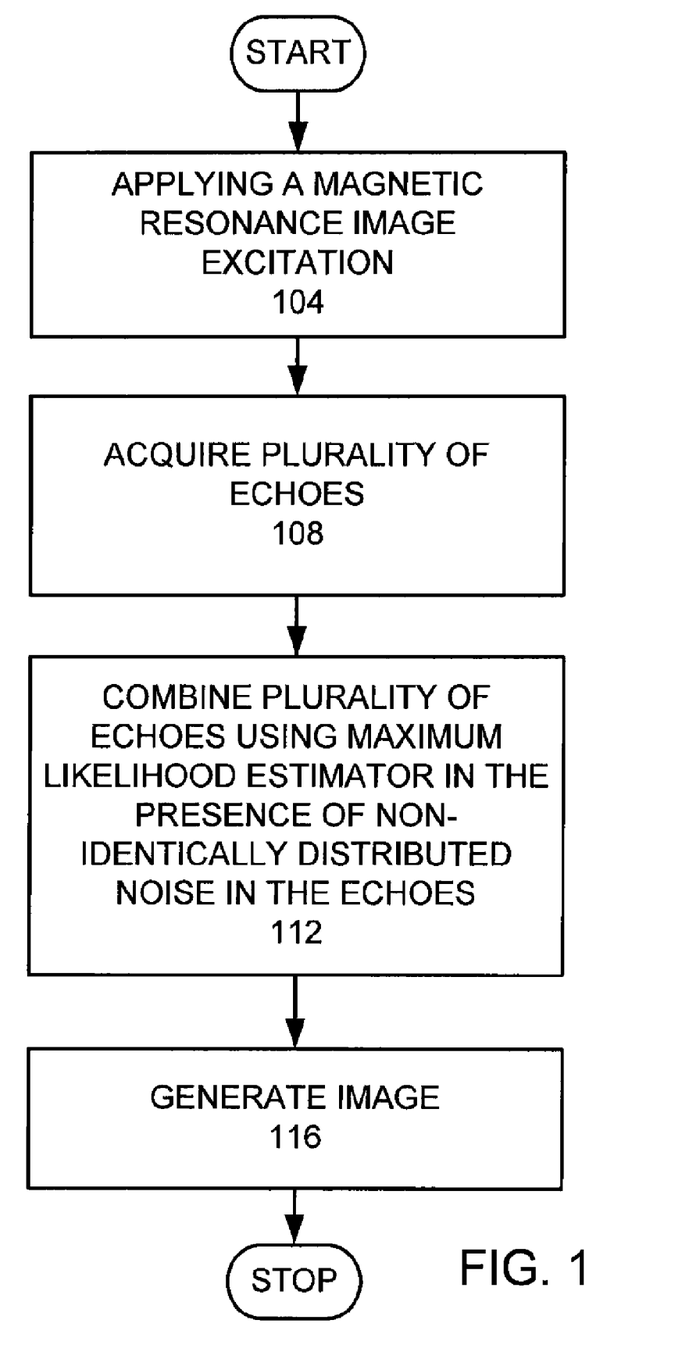
FIG. 1 is a high level flow chart of an embodiment of the invention.

FIG. 1 is a high level flow chart of an embodiment of the invention. A magnetic resonance image (MRI) excitation is applied (step 104). A plurality of echoes is acquired (step 108). The plurality of echoes is combined using a a maximum likelihood estimator in the presence of non-identically distributed noise in the echoes (step 112). An image is generated from the combined echoes (step 116).

EXAMPLES

Figure 2:
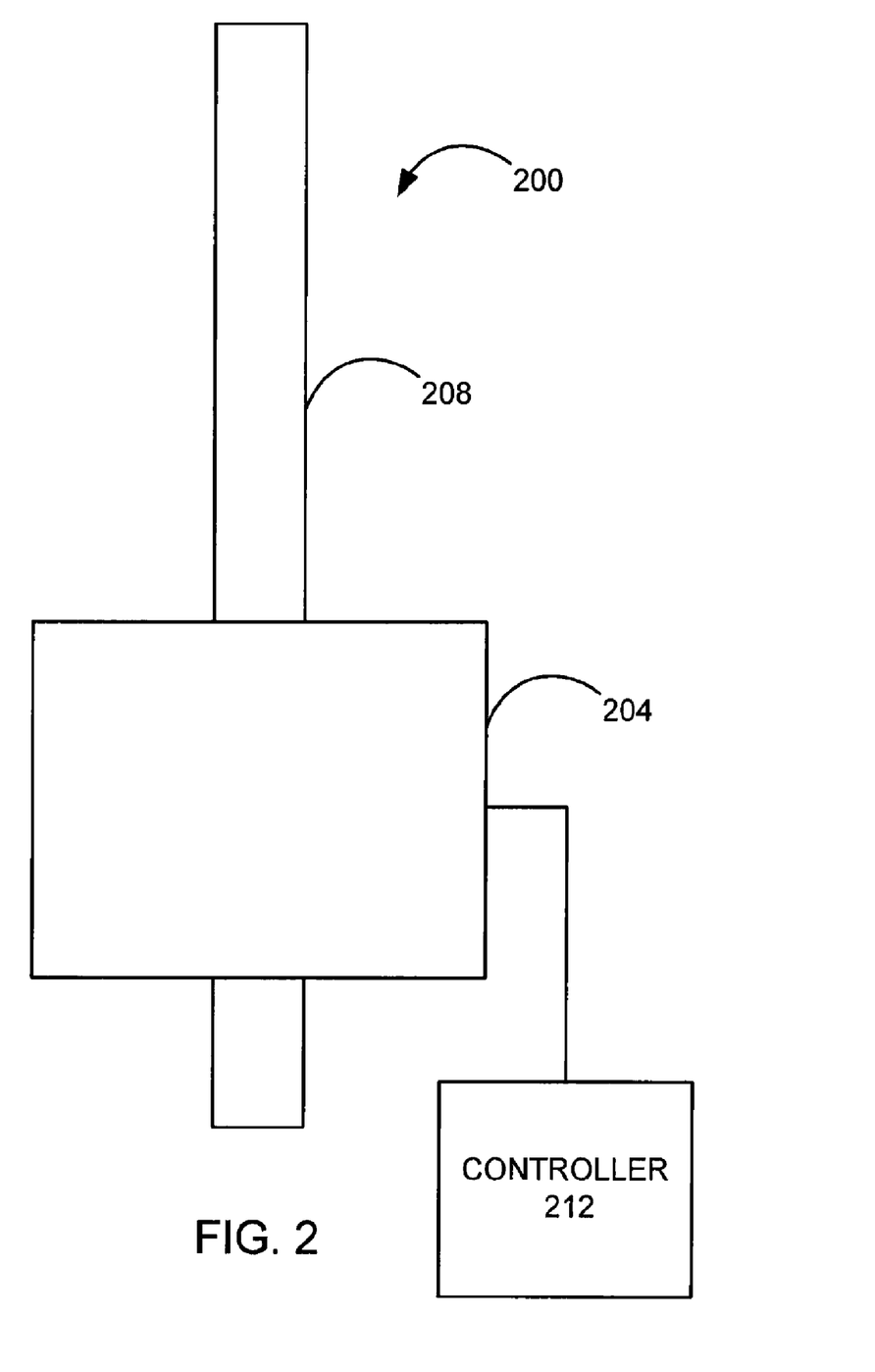
FIG. 2 is a schematic top view of a magnetic resonance imaging (MRI) system 200 that may be used in an embodiment of the invention.

FIG. 2 is a schematic top view of a magnetic resonance imaging (MRI) system 200 that may be used in an embodiment of the invention. The MRI system 200 comprises a magnet system 204, a patient transport table 208 connected to the magnet system, and a controller 212 controllably connected to the magnet system. In one example, a patient would lie on the patient transport table 208 and the magnet system 204 would pass around the patient. The controller 212 would control magnetic fields and radio frequency (RF) signals provided by the magnet system 204 and would receive signals from detectors in the magnet system 204.

Figure 3A:
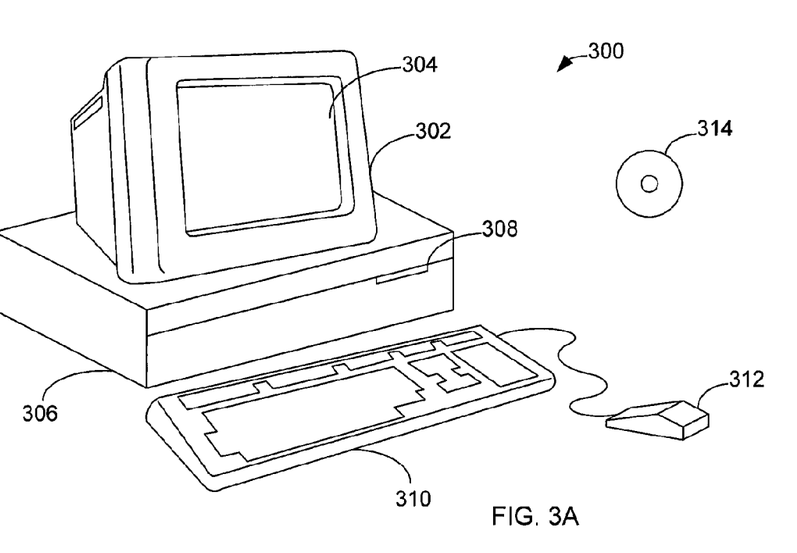
FIGS. 3A and 3B illustrate a computer system, which is suitable for implementing a controller 212 used in embodiments of the present invention.
Figure 3B:
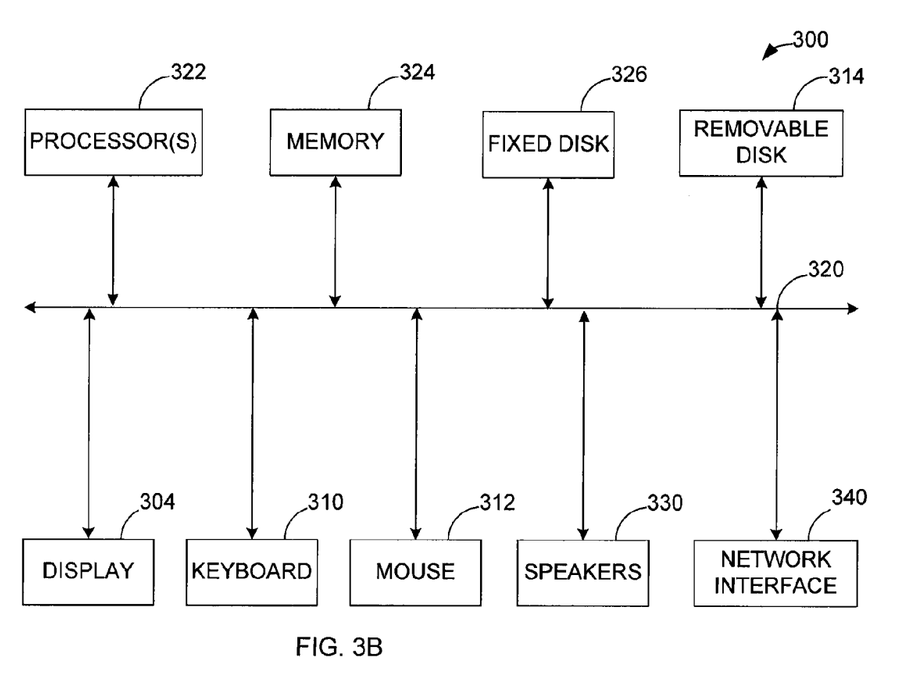

FIGS. 3A and 3B illustrate a computer system 300, which is suitable for implementing a controller 212 used in embodiments of the present invention. FIG. 3A shows one possible physical form of the computer system. Of course, the computer system may have many physical forms ranging from an integrated circuit, a printed circuit board, and a small handheld device up to a huge super computer. Computer system 300 includes a monitor 302, a display 304, a housing 306, a disk drive 308, a keyboard 310, and a mouse 312. Disk 314 is a computer-readable medium used to transfer data to and from computer system 300.

FIG. 3B is an example of a block diagram for computer system 300. Attached to system bus 320 are a wide variety of subsystems. Processor(s) 322 (also referred to as central processing units, or CPUs) are coupled to storage devices, including memory 324. Memory 324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 326 is also coupled bi-directionally to CPU 322; it provides additional data storage capacity and may also include any of the computer-readable media described below. Fixed disk 326 may be used to store programs, data, and the like and is typically a secondary storage medium (such as a hard disk) that is slower than primary storage. It will be appreciated that the information retained within fixed disk 326 may, in appropriate cases, be incorporated in standard fashion as virtual memory in memory 324. Removable disk 314 may take the form of the computer-readable media described below.

CPU 322 is also coupled to a variety of input/output devices, such as display 304, keyboard 310, mouse 312, and speakers 330. In general, an input/output device may be any of: video displays, track balls, mice, keyboards, microphones, touch-sensitive displays, transducer card readers, magnet or paper tape readers, tablets, styluses, voice or handwriting recognizers, biometrics readers, or other computers. CPU 322 optionally may be coupled to another computer or telecommunications network using network interface 340. With such a network interface, it is contemplated that the CPU might receive information from the network, or might output information to the network in the course of performing the above-described method steps. Furthermore, method embodiments of the present invention may execute solely upon CPU 322 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor. It is important for any water-fat separation to be as noise efficient as possible. In cases where the source images used have different noise variance, it is important to weight the images with less variance more than those images with more variance, since they contain less uncertainty in their measurements.

A magnetic resonance image excitation is applied (step 104). In the applying of magnetic resonance image excitation, the controller 212 to use the magnet system 204 and patient transport table 208 to generate a magnetic resonance image excitation.

A plurality of echoes is acquired (step 108). The controller 212 uses the magnet system 204 to acquire the echoes. In this example three echoes are acquired for each excitation. Optimal echo times predicted by Pineda et al. acquire the second of the three echoes in quadrature, re: the phase between the water and fat is such that water and fat are perpendicular to one another i.e. $\pi/2+\pi k$, k=any integer. The first and third echoes are subsequently acquired $2\pi/3$ before and after the second echo, respectively. Such echo combinations have been shown to provide the optimal noise performance for a fat-water separation acquisition. The use of different k-groups permits great flexibility with pulse sequences such as spoiled gradient echo imaging. This has been found and shown by the inventors to be an effective method at both 1.5 and 3.0 T.

The plurality of echoes is combined using a maximum likelihood estimator in the presence of non-identically distributed noise in the echoes (step 112). If the noise is Gaussian and non-identically distributed, the weighted least-squares decomposition algorithm is the maximum likelihood estimator. If the noise was not Gaussian, for example in magnitude images, the maximum likelihood method would lead to a different optimal weighting of the data. For non-identically distributed noise a standard (equally-weighted) least squares algorithm would not be the maximum likelihood estimator, and so standard least square decomposition algorithms would not be used in the invention.

Specific examples that use the above generalized process are as follows:

Parallel Imaging Example

Figure 4:
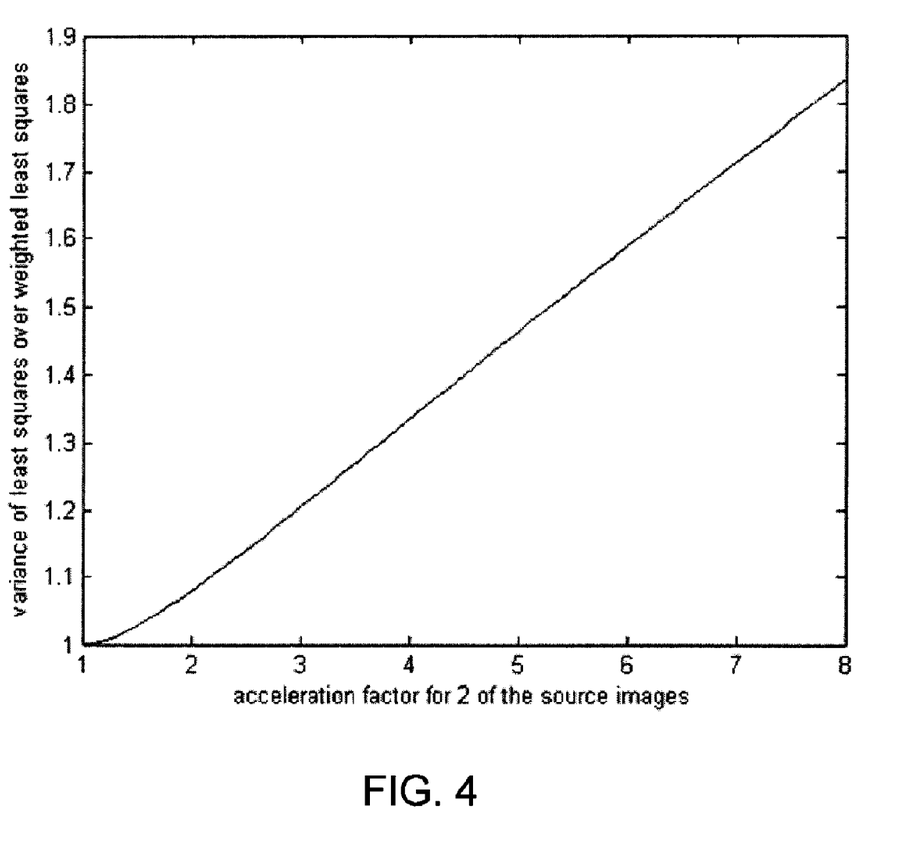
FIG. 4 is a graph of the difference between unweighted and weighted least-squares estimation for different acceleration factors.

Under a Gaussian noise model, the maximum likelihood estimator for non-identically distributed and uncorrelated noise minimizes the weighted least squares functional:

$$\sum_{n=1}^{N} \frac{(g_n - S_n(p))^2}{\sigma_n^2}$$

Where $g_n$ is the $n^{th}$ image, $S_n(p)$ is the prediction model of the $n^{th}$ image given the parameters (p). The parameters for the IDEAL case are the water and fat magnetizations and the field inhomogeneity. The relative importance of weighting images appropriately depends on the difference between the variances of the images. FIG. 4 is a graph of the difference between unweighted and weighted least-squares estimation for different acceleration factors. As the acceleration factor increases the difference between using regular least squares and weighted least squares increases. The graph assumes the use of a self-calibration technique where two images are accelerated, so that the single image which is not accelerated has less variance than the other two.

When the source images have equal variance then the echoes that will give the best noise performance for all fat/water ratios is known. If the source images have different variances then the choice of echoes can change because some source images have less uncertainty than others. For each ratio of variance between the source images the ideal echoes may be different.

In the case where the noise is also correlated between the images, we base our weighting not only on the variance of each image but the full covariance matrix (K):

$$(g_n - S_n(p))^T K^- (g_n - S_n(p)),$$

which in the case for uncorrelated noise reduces to the previous form.

Figure 5A:
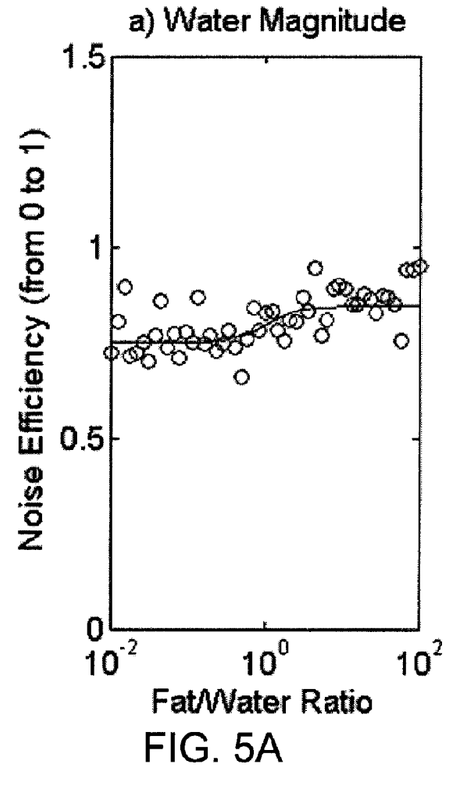
FIGS. 5A-B indicate the theoretical maximum noise efficiency with a solid line and Monte Carlo simulations, using weighted least squares, with circles where the second echo had half as much variance as the first and third echo for echo phase angles $-\pi/6$, $\pi/2$, $7\pi/6$.
Figure 5B:
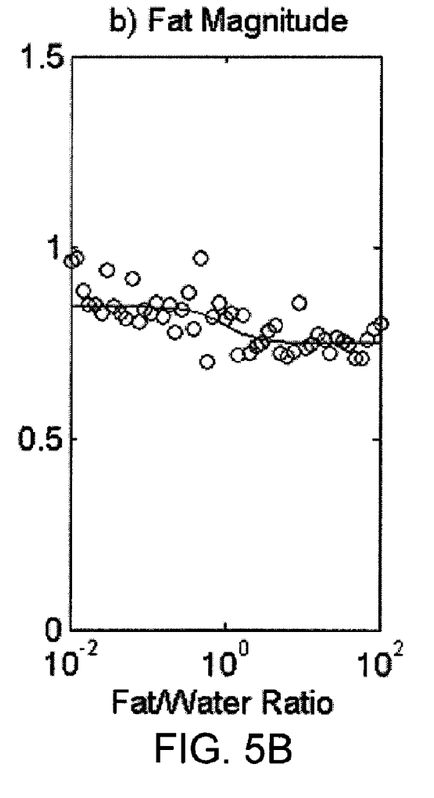
Figure 6A:
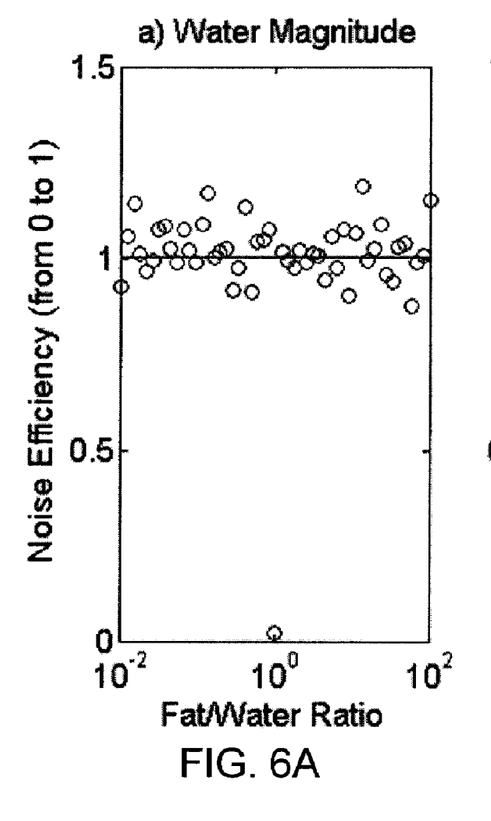
FIGS. 6A-B indicate the theoretical maximum noise efficiency with a solid line and Monte Carlo simulations, using weighted least squares, with circles where the second echo had half as much variance as the first and third echo for echo phase angles $-\pi$, $0$, $\pi$.
Figure 6B:
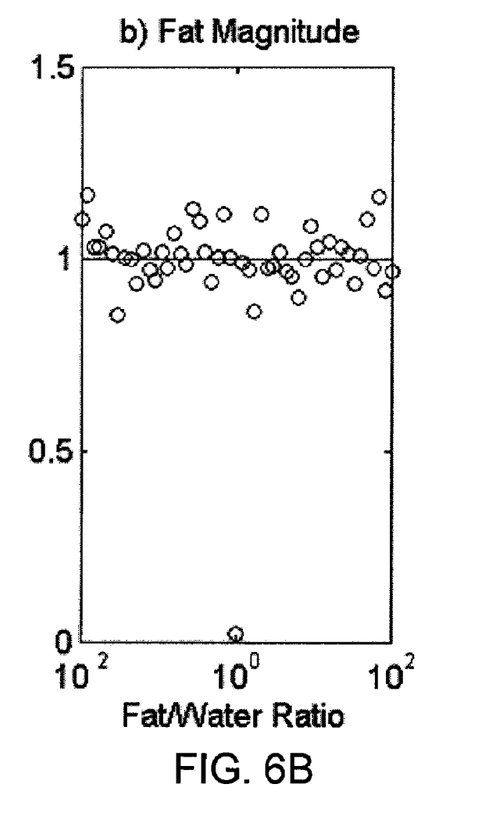

FIGS. 5A-B indicate the theoretical maximum noise efficiency with a solid line and Monte Carlo simulations, using weighted least squares, with circles where the second echo had half as much variance as the first and third echo for echo phase angles $-\pi/6$, $\pi/2$, $7\pi/6$, which is an example of asymmetric echo angles. FIGS. 6A-B indicate the theoretical maximum noise efficiency with a solid line and Monte Carlo simulations, using weighted least squares, with circles where the second echo had half as much variance as the first and third echo for echo phase angles $-\pi$, $0$, $\pi$, which is an example of symmetric echo angles. It can be seen that variances in the source images for symmetric $(-\pi, 0, \pi)$ acquisition has a better noise performance than the standard ideal asymmetric echoes of $(-\pi/6, \pi/2, 7\pi/6)$. It remains to be seen if the asymmetric echoes are optimal in terms of robustness to imperfections in the magnet. Such asymmetric echoes result from minimizing the modified Cramer-Rao bound for images with different variance. Since the source images have different variance, instead of using an NSA of 3 as the best possible, FIGS. 5A-B and FIGS. 6A-B, have redefined noise efficiency from 0 to 1.

Figure 7:
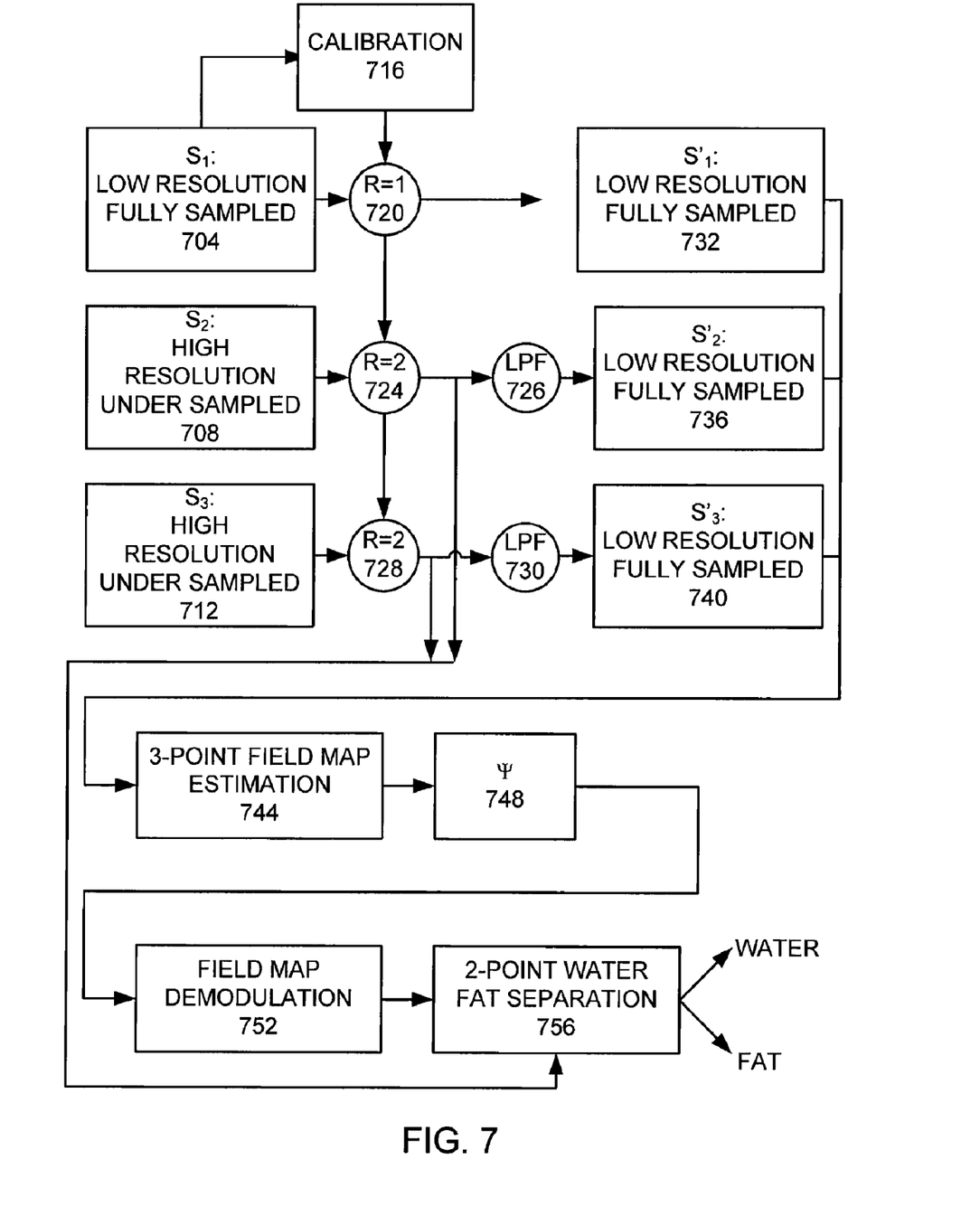
FIG. 7 is a flow chart of a parallel imaging process that uses a weighted least-squares decomposition algorithm.

An example of a parallel imaging process that may use a weighted least-squares decomposition algorithm, where the weighting is dependent on the variance of the echoes, is shown in FIG. 7. The two high-resolution echo sample patterns $S_2$ and $S_3$ 708, 712 can be under-sampled using parallel imaging, while the low-resolution echo sample pattern $S_1$ 704 is fully sampled. In this example, the low resolution $S_1$ has a pattern of 32 lines. $S_2$ and $S_3$ are high resolution, under sampled patterns of 128 lines. In this example, $S_2$ and $S_3$ have the same sampling patterns. As defined, the low resolution pattern has less data than the high resolution pattern.

Figure 8A:
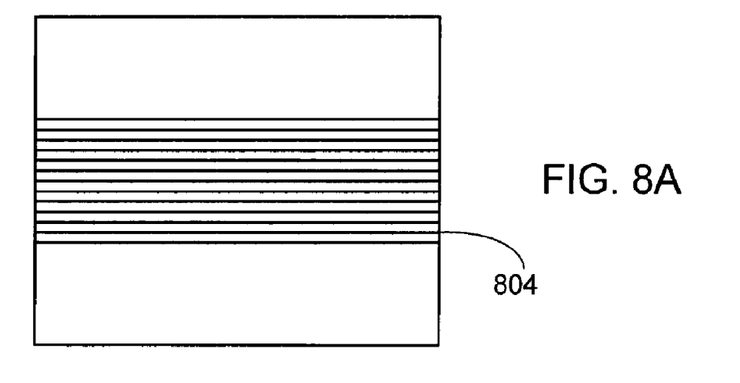
FIGS. 8A-C schematically illustrate different sampling patterns.
Figure 8B:
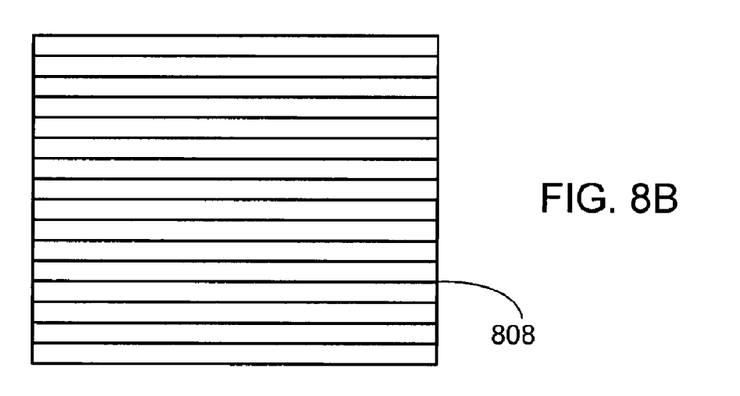
Figure 8C:
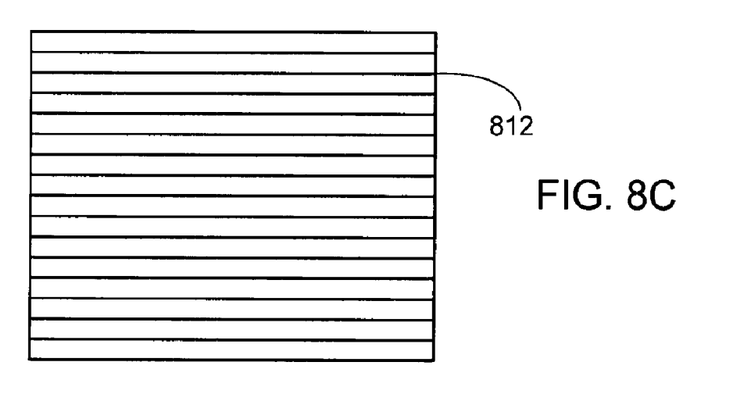

FIGS. 8A-C schematically illustrate a low resolution fully sampled sampling pattern 804 for $S_1$ (FIG. 8A) and high resolution, under sampled sampling patterns 808, 812 for $S_2$ (FIG. 8B) and $S_3$ (FIG. 8C). It should be noted that the low resolution sampling pattern 804 samples only part of the space, so that the high resolution sampling patterns 808, 812 sample a more extended area than the low resolution sampling pattern 804. In this example, the low resolution sampling pattern 804 is fully sampled and the high resolution sampling patterns are under sampled, so that in the lines in the low resolution sampling pattern 804 are denser than the lines in the high resolution sampling patterns 808, 812.

The fully sampled echo $S_1$ can be used in a self-calibrated manner as the coil sensitivity data needed for parallel imaging reconstruction, as discussed by Brau AC et al. in "Accelerated IDEAL Water-Fat Separation Techniques for Single- and Multi-coil Applications" in the 13th Annual International Society of Magnetic Resonance in Medicine Proceedings, 2005, p. 491, which is incorporated by reference for all purposes. This is done by providing SI as an input to a calibration process 716. The fully sampled echo can act as the sensitivity calibration for parallel imaging reconstruction. Such a parallel imaging reconstruction may be a standard package such as SENSitivity Encoding (SENSE). A commercial implementation of SENSE that is used in this example is Array Spatial Sensitivity Encoding Technique (ASSET) The calibration process is used to provide a first reconstruction 720, a second reconstruction 724, and a third reconstruction 728 for parallel imaging. $S_1$ is passed through the first reconstruction 720, with an acceleration or reduction factor of 1 to provide a coil combined, low resolution, fully sampled pattern $S'_1$ 732. $S_2$ is passed through the second reconstruction 724, with an acceleration or reduction factor of 2 and then through a spatial low pass filter 726, which provide a low resolution fully sampled pattern $S'_2$ 736. $S_3$ is passed through the third reconstruction 728, with an acceleration or reduction factor of 2 and then through a spatial low pass filter 730, to provide a low resolution fully sampled pattern $S'_3$ 740. After parallel imaging reconstruction and low-pass filtering of the high-resolution echoes, the field map is estimated from all three low-resolution echoes 744, represented by $\Psi$ 748. In this example, IDEAL is used to provide the 3-point field map estimation. Subsequent field map demodulation and fat-water decomposition 752, 756 are performed only on the two high-resolution echoes after parallel imaging reconstruction 724 and 728 by using the field map 748, determined in previous steps. This modification combines the scan time reduction offered by parallel imaging with the scan time reduction offered by reduced sampling for a net scan time reduction greater than either method could achieve alone.

Since the 2+ IDEAL decomposition is performed on only two images, the IDEAL reconstruction after the field map demodulation step (752) effectively becomes a 2-pt water-fat separation method, and the IDEAL echo times must therefore be recalculated to optimize the noise performance for this case. Optimal echo spacing can be determined in a manner similar to that described by A. Pineda, S. Reeder, Z. Wen, H. Yu, N. Pelc in "Cramer-Rao Bounds for 3-Point Decomposition of Water and Fat", Magn. Reson. Med. (2005) 54(3):625-635 (hereinafter Pineda et al.), which is incorporated by reference for all purposes.

$T_2$* Example

In one example where T2* (the relaxation time) is used signal amplitude decreases due to signal decay. As the signal decays, the signal to noise ratio decrease, which would result in a lower weighting as the signal decays. An example that uses T2* as a result of iron overload, is as follows:

In the presence of iron overload, this example of the invention assumes that the shortened T2* effect is dominated by the presence of iron, and as a result, the water and fat components that co-exist in the same voxel have similar values of T2*. The signals ($S_i$) of a voxel at the echo times ($t_i$, i=1, 2, 3 . . . k, k=number of echoes acquired) can be represented as:

$$s_i = (w + f \cdot e^{j2\pi\Delta f t_i}) \cdot e^{j2\pi\psi t_i} \cdot e^{-R_2^* t_i} + n_i \quad [1]$$

$$= (w + f \cdot e^{j2\pi\Delta f t_i}) \cdot e^{j2\pi(\psi + jR_2^*/2\pi)t_i} + n_i$$

$$= (w + f \cdot e^{j2\pi\Delta f t_i}) \cdot e^{j2\pi\hat{\psi} t_i} + n_i$$

where w and f denote the water and the fat components in this voxel, respectively. $\Delta f$ is the chemical shift of fat with respect to water. $\psi$ represents the $B_0$ field inhomogeneity (in Hz), or field map, at this voxel. $n_i$ is the noise in the signal. R2* is used for convenience. Furthermore, a "complex field map" is introduced:

$$\hat{\psi} = \psi + j\frac{R_2^*}{2\pi} \quad [2]$$

With this "complex field map", $\hat{\psi}$, Equation [1] has the same form as the signal model used in the IDEAL algorithm. Therefore, water, fat and $\hat{\psi}$ can be calculated in a similar way as the classic IDEAL algorithm. First, the "complex field map" $\hat{\psi}$ is solved using the iterative algorithm described in Reeder et al., with the adjustment of treating $\hat{\psi}$ as a complex value. The converged value of $\hat{\psi}$ is then decomposed with the real and imaginary parts assigned to the field map and the R2* map estimates. The source signals are demodulated by $\hat{\psi}$, thereby correcting for both $B_0$ field inhomogeneity and T2* decay simultaneously, as denoted in Eq. [3]

$$s_i' = s_i \cdot e^{-j2\pi\hat{\psi} t_i} = w + f \cdot e^{j2\pi\Delta f t_i} + n_i \cdot e^{-j2\pi\hat{\psi} t_i} \quad [3]$$

Considering all echoes, Equation [3] can be formulated in a matrix form:

$$s' = \begin{bmatrix} s_1' \\ s_2' \\ \dots \\ s_k' \end{bmatrix} = \begin{bmatrix} 1 & e^{j2\pi\Delta f t_1} \\ 1 & e^{j2\pi\Delta f t_2} \\ \dots \\ 1 & e^{j2\pi\Delta f t_k} \end{bmatrix} \cdot \begin{bmatrix} w \\ f \end{bmatrix} + \begin{bmatrix} n_1 e^{-j2\pi\hat{\psi} t_1} \\ n_2 e^{-j2\pi\hat{\psi} t_2} \\ \dots \\ n_k e^{-j2\pi\hat{\psi} t_k} \end{bmatrix} \quad [4]$$

$$= A \cdot \begin{bmatrix} w \\ f \end{bmatrix} + n'$$

Note that with the T2* correction, the variance of the noise (n') is no longer equal for all echoes:

$$\text{var}(s_i') = \text{var}(n_i') = \text{var}(n_i) \cdot e^{2R_2 t_i} \quad [5]$$

Equation [5] suggests that the source signals after correction for field map and T2*(s') have less noise at earlier echoes, which is an intuitive result as signals decay away exponentially. To account for the different noise variance, unlike the classic IDEAL algorithm, where a linear least squares inversion is used, this embodiment obtains water and fat components from a weighted least squares inversion, shown in the following Equation:

$$\begin{bmatrix} w \\ f \end{bmatrix} = (A^T \cdot W \cdot A)^{-1} \cdot A^T \cdot W \cdot s' \quad [6]$$

where the weights are given by $W = \text{diag}(e^{2R_2^* t_1}, e^{2R_2^* t_2}, \dots, e^{2R_2^* t_k})$. The value of R2* is obtained from the iterative estimation of $\hat{\psi}$ as described earlier.

In this example, the combining of the echoes results in the generation of separate water and fat signals. The water and fat signals may be used to generate an image (step 116).

Preferably, Dixon species separation or iterative weighted least-squared decomposition with echo asymmetry and weighted least squares estimation (IDEAL) is used to combine the plurality of echoes and generate a first species signal and a second species signal. In other embodiments, other processes are used.

The generation of a first species signal and a second species signal from the same magnetic resonance data is described in U.S. patent application Ser. No. 10/690,230, by Reeder et al. entitled "Magnetic Resonance Imaging of Different Chemical Species in a System Having Magnetic Field Heterogeneities," filed on Oct. 23, 2003, which is incorporated by reference for all purposes.

An embodiment of the invention uses relaxation times ($T_1$, $T_2$, $T_2^*$) and corrects the relaxation times for quantification of a species. Species that have a short $T_1$ recover faster and therefore have a higher intensity signal, appearing brighter than other species. A correction factor (or weight) may be used to correct this. For short $T_2^*$ periods, the presence of iron may correct the $T_2^*$ measurement. Different species such as fat and water may require different corrections. By providing a separate fat signal and a separate water signal, the different corrections may be provided to the different signals.

More specific details regarding implementation of various embodiments are discussed below.

A characterization of the theoretical maximum noise performance of water-fat decomposition, including the effects of the field inhomogeneities estimation, was reported in A. Pineda, S. Reeder, Z. Wen, H. Yu, N. Pelc Cramer-Rao, "Bounds for 3-Point Decomposition of Water and Fat", Magn. Reson. Med. (2005) 54(3):625-635 (hereinafter Pineda et al.). This work showed that the theoretical ability of all water-fat separation methods to decompose water from fat in a voxel is dependent on the relative proportions of water and fat, as well as the position of acquired echoes relative to the spin-echo. The dependence on the proportions of water and fat is particularly true for echoes that are acquired symmetrically about the spin-echo. This theory has been extended to spoiled gradient echo imaging (SPGR).

The invention may use any method for fat-water separations such as, and therefore is not limited to IDEAL, which has the potential to measure complex coil sensitivity maps that are free of the effects of chemical shift artifact.

U.S. patent application Ser. No. 10/690,230, by Reeder and Pelc, entitled "Magnetic Resonance Imaging of Different Chemical Species in a System Having a Magnetic Field Heterogeneities" filed on Oct. 20, 2003 teaches using least squares.

The separation of water and fat provides a unique opportunity to recombine images in various combinations that may be helpful for particular diagnostic considerations. For example, with fatty infiltration of the liver or other organs, a "fat fraction image" can be calculated as the proportion of fat signal (fat/(fat+water)) within the liver and may be important to gauge the severity of the disease. In addition, recombined "in-phase" and "out of phase" images calculated as: (abs (water)+abs(fat)) and abs(abs(water)−abs(fat)), respectively, are analogous to in and out of phase imaging that is routinely performed for most MR liver protocols. Other possibilities include a fat:water ratio image (fat/water), and so on.

With separate water and fat images, a variety of new image combinations can be generated. Recombined images can be generated with the simple sum and difference of the calculated water and fat images, analogous to conventional "in-phase" and "out of phase" images that are commonly acquired for adrenal and liver imaging. This is also beneficial to distinguish between benign lesions of the bone from metastases; benign lesions contain fat and show decreased signal with out of phase imaging. Other possible calculated images, such as a "fat fraction" image (i.e.: fat/(water+fat)) or "fat:water ratio" image (i.e.: fat/water) may be beneficial, particularly for quantitative applications such as characterization of hepatic steatosis and microscopic fat seen in adrenal adenomas, and possibly other entities. True quantitative measures of fat content will require knowledge of relaxation parameters within these tissues in order to give absolute measures of fatty infiltration.

Pineda et al. performed a comprehensive noise analysis of three-point water-fat separation methods. This work demonstrated that the theoretical optimal combination of echoes for a three-point fast spin-echo (FSE) acquisition occurred when the phase between water and fat phase was: $-\pi/6$, $\pi/2$, $7\pi/6$. This combination of echoes has been applied to FSE imaging using an iterative least-squares water-fat separation method that allows for arbitrarily and unequally spaced echo shifts. Experimental validation of the noise performance showed that the maximum possible SNR of the FSE water and fat images was achieved. This method has been applied to various FSE applications, including the ankle, brachial plexus and cervical spine, as well as balanced steady-state free precession (SSFP) imaging in the knee and heart.

Validation of the noise behavior for GRE imaging is important because the overall predicted noise behavior for gradient echo imaging is different than either FSE or SSFP imaging. It can be shown that the optimal choice of echoes that maximizes the noise performance of magnitude images leads to lower noise performance for the phase and field map for GRE imaging, compared to FSE or SSFP. This is related to the fact that all echo shifts for GRE imaging must be greater than zero, while echo shifts can be negative for FSE because echoes can be acquired before the refocusing of the spin-echo. This effect also occurs with SSFP, because of the 180° relative phase shift between water and fat at TE=TR/2 for certain choices of TR. Therefore, experimental validation of the noise performance for IDEAL-GRE imaging is necessary in order to show that the optimal noise performance is achievable even in the presence of higher uncertainty in the phase and field maps.

For the combining of IDEAL with GRE imaging at 1.5 T and 3.0 T, experimental validation of the noise performance of the water-fat separation was performed in order to optimize noise performance and overall image quality. Clinical results, including examples of imaging in the liver, breast, knee, ankle, and heart are shown. Finally, the recombination of water and fat images in new ways such as "fat fraction" images is described, and may be helpful for the quantification of fatty infiltration or other pathologies.

Theory:

Noise Performance

The noise performance of a water-fat decomposition is conveniently described with the effective number of signal averages, or NSA, defined as $$NSA = \frac{\sigma^2}{\sigma_p^2} \quad [7]$$

where $\sigma^2$ is the variance of the noise in a source image and $\sigma_p^2$ is the variance of the noise in a calculated water or fat image. The NSA is a useful measure of the noise performance of a water-fat decomposition, and has an intuitive basis: For any three-point water-fat decomposition method, the maximum possible NSA is three, which is equivalent to what would be obtained if the object contained only water or only fat, and the three source images were averaged. Eq. 7 will be used experimentally to determine the noise performance of the IDEAL-GRE method.

Optimal Echo Shifts

The phase shift between water and fat from an echo acquired at time t relative to TE=0, can be written, $$\theta = 2\pi\Delta f\, t \quad [8]$$

where $\Delta f$ is the chemical shift between water and fat, ($-210$ Hz at 1.5 T and $-420$ Hz at 3.0 T). Phase shifts are more convenient than echo shifts, because they are independent of field strength and are more intuitive, providing more physical meaning to the water-fat separation problem.

As predicted by Pineda et al., one set of optimal echo shifts for the three images with equal variance occur when the water-fat phase is, $1^{st}$ echo: $-\pi/6+\pi k$ $2^{nd}$ echo: $\pi/2+\pi k$ $3^{rd}$ echo: $7\pi/6+\pi k$, $k$=any integer [9]

This echo combination has an intuitive basis as follows. In the "perfect" NMR experiment, there are no constant phase shifts or $B_o$ inhomogeneities, and an image acquired with an echo time that has water and fat in quadrature, i.e.: $\pi/2+\pi k$, can be used to separate water from fat with that single image: water and fat are simply the real and imaginary components of the complex image. However, the presence of unknown constant phase shifts and $B_o$ inhomogeneities requires additional information. The acquisition of two additional images 120°($2\pi/3$) before and after the second echo located at $\pi/2+\pi k$ provides uniform sampling around the unit circle, providing the optimal noise performance in the estimation of water and fat from the three source images. It is important to note, that the center echo must be in quadrature; echo combinations with the first or third echo in quadrature will not have optimum noise performance.

Echo shifts that satisfy Eq. 9 will have optimal noise performance. However, noise performance is poor when the second echo is acquired when water and fat are aligned, i.e.: any multiple of $2\pi$, even if the spacing between all three echoes remains at $2\pi/3$. In this case, the NSA is three when a voxel contains all water, but is significantly reduced for voxels that contain all fat, and has a broad minimum approaching zero for voxels containing mixtures of water and fat in near equal proportions. This echo combination can lead to image artifacts that include irregular margins at the interface between tissues with water signal (e.g. muscle) and fat signal (e.g. subcutaneous fat), as a result of partial volume effects. In addition, areas of the calculated water image that contain mostly fat signal (e.g. bone marrow and subcutaneous fat) appear noisy.

The choice of echo group, determined by the echo group index k, will depend on the minimum TE ($TE_{min}$) of the sequence. Typically, k is chosen to minimize the echo times, but ensure that they are all greater than $TE_{min}$. For example, at 1.5 T one possible echo combination for IDEAL-GRE imaging occurs for k=1, with echo shifts of 2.0 ms, 3.6 ms and 5.2 ms, so long as $TE_{min}$ is 2.0 ms or less. It is worthwhile to note that spacing between echo groups decreases with increasing field strength: the time between consecutive echo groups at 1.5 T is approximately 2.4 ms compared to a spacing of 1.2 ms at 3.0 T. The decrease in time between echo groups and the fact that echoes within a group are more closely spaced with increasing field strength, makes IDEAL more flexible and more efficient for imaging at 3.0 T.

Pulse Sequence and Image Reconstruction

IDEAL uses an iterative least-squares method that is compatible with multi-coil imaging. In this method, an iterative method is used to determine the local field map ($B_o$ inhomogeneity) in the least squares sense. The field map is subsequently demodulated from the signal in the source images. This signal is then decomposed into separate water and fat signals using a least-squares solution matrix inversion. This latter step is similar to a least-squares approach described in L. An, Q. S. Xiang, "Chemical Shift Imaging with Spectrum Modeling", Magn. Reson. Med. (2001) 46(1):126-130 (hereinafter An), which are restricted to equally spaced echo shifts. IDEAL uses a region growing reconstruction algorithm to prevent water-fat "swaps" that can occur from the natural ambiguity between water and fat signals, e.g. for an acquisition at 1.5 T with the center frequency set to water, water that is off-resonance by −210 Hz has similar signal to fat that is on-resonance.

Materials and Methods:

By using optimized echo shifts where the phase shift between water and fat of the central echo is in quadrature ($\pi/2+\pi k$), and the first and third echoes are acquired $2\pi/3$ before and after the central echo, respectively, the maximum SNR performance can be achieved. These combinations of echoes also avoid image artifacts that are related to the noise performance of all water-fat separation methods, which in general, depends on the water/fat composition of a voxel.

Noise behavior, as quantified experimentally with the NSA, showed good agreement with theoretical predictions. The experimental data for the quadrature echo combination was in close agreement with the predicted theoretical maximum of three, providing high SNR performance for all fat/water combinations. A marked decrease in noise performance was seen for intermediate combinations of water and fat. The qualitative behavior was very similar to that seen previously for FSE with an asymmetric NSA curve; however, the broad minimum of the GRE data appears somewhat wider. This may have occurred because the theoretical predictions for NSA assumed very high SNR source images, and the prior experiments were made with FSE images that had very high SNR. Regardless, the data from the quadrature echo combination shows good agreement with the theoretical maximum of three for all fat:water ratios and shows tremendous improvement from the aligned echo combination.

The theoretical work by Pineda et al., also showed that the spacing between the echoes could also be other multiples of $2\pi/3$. For example, spacing between echoes of $4\pi/3$ or $8\pi/3$ (but not $6\pi/3=2\pi$) would also provide the optimal noise performance. For echoes acquired in different TRs, combinations with longer spacing than necessary should be avoided to avoid effects of $T_2^*$. Longer echo spacing may be useful for multi-echo water-fat separation methods, such as that described in O. Wieben, J. Leupold, S. Mansson, J. Hennig, "Multi-Echo Balanced SSFP Imaging for Iterative Dixon Reconstruction," (2005) The International Society of Magnetic Resonance 13th Meeting, p. 2386, to increase the sequence flexibility allowing long readout windows that are necessary for low bandwidth and/or high matrix size imaging.

IDEAL is a highly SNR efficient method, using the information acquired in the source images very efficiently in the estimation of the calculated water and fat images. In fact, IDEAL is much more efficient than applications that use conventional fat saturation pulses: the decrease in sequence efficiency from echo shifting is less than the time required to execute fat-saturation pulses. However, IDEAL requires a longer minimum scan time based on the need to acquire three images with different echo times. This makes IDEAL particularly well suited for applications that already use multiple averages such as cartilage imaging where the limiting factors of conventional fat-saturated SPGR are SNR and image resolution. Improving sequence efficiency permits improved SNR and/or image resolution within the same scan time.

Because an embodiment of the invention uses IDEAL, this embodiment can use arbitrarily spaced echoes, other echo combinations can be used, and small deviations from the optimal echo choices have minimal impact on noise performance if these deviations are small. This increased flexibility may be valuable in the case where $TE_{min}$ just exceeds the minimum echo time of a particular echo group. For most GRE applications, speed and sequence efficiency are the most important priority and the shortest echo group is chosen; however, $T_2^*$ weighted images are easily generated by increasing the echo group index.

Another way of describing asymmetrically positioned echoes is that the species phase angles of the echo times have a difference that is not $k^*\pi$, where k is an integer.

U.S. patent application Ser. No. 11/738,339 by Scott B. Reeder et al., entitled "MRI METHODS FOR COMBINING SEPARATE SPECIES AND QUANTIFYING A SPECIES" filed concurrently herewith, teaches MRI methods for combining separate species and quantifying a species; U.S. patent application Ser. No. 11/738,340 by Charles A. McKenzie et al., entitled "SELF-CALIBRATION METHODS FOR PARALLEL IMAGING AND MULTIPOINT WATER-FAT SEPARATION METHODS" filed concurrently herewith, teaches self-calibration methods for parallel imaging and multipoint water-fat separation methods; U.S. patent application Ser. No. 11/738,345 by Zhifei Wen et al., entitled "REGULARIZED SPECIES SEPARATION" filed concurrently herewith, teaches regularized species separation; U.S. patent application Ser. No. 11/738,347 by Huanzhou Yu et al., entitled "SLIDING WINDOW RECONSTRUCTION AND PHASE/FIELD MAP UPDATING FOR DYNAMIC CHEMICAL SHIFT IMAGING" filed concurrently herewith, teaches sliding window reconstruction and phase/field map updating for dynamic chemical shift imaging; U.S. patent application Ser. No. 11/738,350 by Huanzhou Yu et al., entitled "SIMULTANEOUS CHEMICAL SPECIES SEPARATION AND $T_2^*$ MEASUREMENT USING MRI" filed concurrently herewith, teaches simultaneous chemical species separation and $T_2^*$ measurement using MRI; U.S. patent application Ser. No. 11/738,352 by Charles A. McKenzie et al., entitled "CALIBRATION MAPS FOR PARALLEL IMAGING FREE OF CHEMICAL SHIFT ARTIFACT" filed concurrently herewith, teaches calibration maps for parallel imaging free of chemical shift artifact, all of which are incorporated by reference herein.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method of separating signals from at least two species in a body using echo-coherent time magnetic resonance imaging comprising the steps of:
    a) acquiring a plurality of echo signals; and
    b) combining the plurality of echo signals iteratively by using a maximum likelihood estimator for non-identically distributed noise decomposition algorithm.

2. The method as recited in claim 1, wherein at least two echo signals of the plurality of echo signals have different variance from each other.

3. The method, as recited in claim 2, wherein a difference in sampling patterns causes the at least two echo signals of the plurality of echo signals to have different variance.

4. The method, as recited in claim 2, wherein signal decay causes the at least two echo signals of the plurality of echo signals to have different variance.

5. The method, as recited in claim 2, wherein correction for signal decay causes the at least two echo signals of the plurality of echo signals to have different variance.

6. The method, as recited in claim 2, wherein chemical species decomposition and parallel imaging results in images with different variance with correlated noise.

7. The method, as recited in claim 2, wherein an optimization of an acquisition based on a weighted-least squares model provides different optimal measurements than an optimization of an acquisition based on a non-weighted least-squares model for images with the same variance.

8. The method, as recited in claim 2, further comprising applying a magnetic resonance image excitation.

9. The method, as recited in claim 2, wherein the plurality of signals is at least three echo signals.

10. The method, as recited in claim 9, wherein a difference in sampling patterns causes the at least two echo signals of the plurality of echo signals to have different variance.

11. The method, as recited in claim 10, wherein chemical species decomposition and parallel imaging results in images with different variance with correlated noise.

12. The method, as recited in claim 2, wherein the maximum likelihood estimator for non-identically distributed noise decomposition algorithm is a weighted least-squares decomposition algorithm, wherein weighting of the weighted least-squares decomposition algorithm is dependent on a difference in variances.

13. The method, as recited in claim 2, wherein the at least three echo signals have acquisition times asymmetrically positioned with respect to an echo time.

14. The method, as recited in claim 2, wherein for the asymmetrically placed echo times there exists at least two of the plurality of echo signals where species phase angles of the echo times have a difference that is not $k*\pi$, where k is an integer.

15. A method of separating signals from at least two species in a body using magnetic resonance imaging comprising the steps of:
    a) applying a magnetic resonance image excitation;
    b) acquiring a plurality of echo signals, at different echo times, wherein at least two echo signals of the plurality of echo signals have different variance from each other; and
    c) combining the plurality of echo signals iteratively by using a weighted least-squares decomposition algorithm, wherein a weighting of the weighted least-squares decomposition algorithm is dependent on a difference in the variances.

16. The method, as recited in claim 15, wherein there exists at least two of the plurality of echo signals where species phase angles of the echo times have a difference that is not $k*\pi$, where k is an integer.

17. The method, as recited in claim 15, wherein the plurality of signals is at least three echo signals.

18. The method, as recited in claim 15, wherein chemical species decomposition and parallel imaging results in images with different variance.

19. An apparatus for separating signals from at least two species in a body using echo-coherent time magnetic resonance imaging for providing magnetic resonance images, comprising:
    a magnet system;
    a controller electrically connected to the magnet system, comprising:
        a display;
        at least one processor; and
        computer readable media, comprising:
            computer readable code for signaling the magnetic system to apply a magnetic resonance imaging excitation;
            computer readable code for signaling the magnetic system to acquire a plurality of magnetic resonance image echo signals at different echo times, wherein at least two echo signals of the plurality of echo signals have different variance from each other;
            computer readable codes for combining the plurality of echo signals iteratively by using a maximum likelihood estimator for non-identically distributed noise decomposition algorithm, wherein a weighting of the weighted least-squares decomposition algorithm is dependent on a difference in the variances; and
            computer readable code for displaying an image created from combining the plurality of echo signals iteratively on the display.

20. The apparatus, as recited in claim 19, wherein the maximum likelihood estimator for non-identically distributed noise decomposition algorithm is a weighted least-squares decomposition algorithm, wherein weighting of the weighted least-squares decomposition algorithm is dependent on a difference in variances.

* * * * *

UNITED STATES PATENT AND TRADEMARK OFFICE
CERTIFICATE OF CORRECTION

| | | |
|---|---|---|
| PATENT NO. | : 7,592,807 B2 | Page 1 of 1 |
| APPLICATION NO. | : 11/738343 | |
| DATED | : September 22, 2009 | |
| INVENTOR(S) | : Pineda et al. | |

It is certified that error appears in the above-identified patent and that said Letters Patent is hereby corrected as shown below:

In the Specification:

Please replace Column 1, Line no. 18-20 with

-- This invention was made with Government support under contract RR009784 awarded by the National Institutes of Health. The Government has certain rights in this invention. --

Signed and Sealed this
Eighteenth Day of November, 2014

Michelle K. Lee
*Deputy Director of the United States Patent and Trademark Office*